US00RE47562E

(19) United States
(12) Reissued Patent
Cheng et al.

(10) Patent Number: US RE47,562 E
(45) Date of Reissued Patent: Aug. 6, 2019

(54) STRAINED-CHANNEL SEMICONDUCTOR DEVICE FABRICATION

(71) Applicant: TAIWAN SEMICONDUCTOR MANUFACTURING COMPANY, LTD., Hsin-Chu (TW)

(72) Inventors: Chun-Fai Cheng, Hong Kong (TW); Bwo-Ning Chen, Keelung (TW); Chin-Te Su, Taoyuan County (TW); Huang-Sheng Ho, Hsin Chu (TW)

(73) Assignee: TAIWAN SEMICONDUCTOR MANUFACTURING COMPANY, LTD., Hsin-Chu (TW)

(21) Appl. No.: 15/336,600

(22) Filed: Oct. 27, 2016

Related U.S. Patent Documents

Reissue of:
(64) Patent No.: 8,872,228
Issued: Oct. 28, 2014
Appl. No.: 13/469,526
Filed: May 11, 2012

(51) Int. Cl.

| | |
|---|---|
| ***H01L 29/66*** | (2006.01) |
| ***H01L 21/336*** | (2006.01) |
| ***H01L 21/8234*** | (2006.01) |
| ***H01L 21/8238*** | (2006.01) |
| ***H01L 29/78*** | (2006.01) |
| ***H01L 27/092*** | (2006.01) |

(52) U.S. Cl.
CPC ..... *H01L 21/823807* (2013.01); *H01L 21/823814* (2013.01); *H01L 27/0922* (2013.01); *H01L 29/66636* (2013.01); *H01L 29/7848* (2013.01)

(58) Field of Classification Search
CPC ..... H01L 27/0922; H01L 29/66636; H01L 29/7848
See application file for complete search history.

(56) References Cited

U.S. PATENT DOCUMENTS

| | | | | |
|---|---|---|---|---|
| 2004/0227185 | A1* | 11/2004 | Matsumoto et al. | 257/347 |
| 2005/0029601 | A1* | 2/2005 | Chen | H01L 21/82380 257/369 |
| 2005/0148142 | A1* | 7/2005 | Cabral et al. | 438/280 |
| 2005/0280098 | A1* | 12/2005 | Shin et al. | 257/371 |
| 2006/0002278 | A1 | 1/2006 | Kitazawa | |
| 2006/0151808 | A1* | 7/2006 | Chen | H01L 21/26506 257/188 |
| 2006/0202278 | A1* | 9/2006 | Shima et al. | 257/369 |
| 2007/0012913 | A1* | 1/2007 | Ohta | H01L 21/823807 257/19 |
| 2007/0045729 | A1* | 3/2007 | Hoentschel et al. | 257/344 |
| 2007/0054457 | A1* | 3/2007 | Ueno et al. | 438/299 |
| 2007/0096149 | A1* | 5/2007 | Liu | H01L 21/823807 257/192 |

(Continued)

*Primary Examiner* — Sean E Vincent
(74) *Attorney, Agent, or Firm* — Haynes and Boone, LLP

(57) ABSTRACT

A method for controlling IC device strain and the devices thereby formed are disclosed. An exemplary embodiment includes receiving an IC device substrate having a device region corresponding to an IC device. An implantation process is performed on the device region forming an amorphous region within the device region. The IC device substrate is recessed to define a source/drain recess in the device region having a profile determined by the amorphous structure of the amorphous region. A source/drain epitaxy is then performed to form a source/drain structure within the source/drain recess.

23 Claims, 8 Drawing Sheets

(56) References Cited

U.S. PATENT DOCUMENTS

| | | | | |
|---|---|---|---|---|
| 2007/0200170 | A1* | 8/2007 | Yamasaki | H01L 21/82380 257/330 |
| 2008/0014688 | A1* | 1/2008 | Thean et al. | 438/197 |
| 2008/0164491 | A1* | 7/2008 | Liu | H01L 21/823807 257/190 |
| 2009/0022115 | A1 | 1/2009 | Berzin et al. | |
| 2009/0026552 | A1* | 1/2009 | Zhang et al. | 257/401 |
| 2009/0221115 | A1* | 9/2009 | Scott et al. | 438/199 |
| 2009/0258463 | A1* | 10/2009 | Kim et al. | 438/142 |
| 2011/0042729 | A1* | 2/2011 | Chen | H01L 21/31116 257/288 |
| 2013/0015443 | A1* | 1/2013 | He | H01L 21/02532 257/57 |
| 2013/0082309 | A1* | 4/2013 | Su | H01L 29/66636 257/288 |
| 2013/0126949 | A1* | 5/2013 | Liao | H01L 29/66636 257/288 |
| 2013/0146895 | A1* | 6/2013 | Tsai | H01L 21/823412 257/77 |
| 2013/0178029 | A1* | 7/2013 | Wang | H01L 21/26506 438/285 |
| 2013/0181262 | A1* | 7/2013 | Chang | H01L 21/823807 257/288 |
| 2013/0228862 | A1* | 9/2013 | Lee | H01L 21/823807 257/347 |

* cited by examiner

STRAINED-CHANNEL SEMICONDUCTOR DEVICE FABRICATION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

Unqualified improvements are not always possible. Often technological advances have drawbacks that must be balanced against the benefits conveyed. These drawbacks may render a refinement that is appropriate for one application undesirable elsewhere. For example, increasing IC device strain improves carrier mobility through the channel region but also increases device leakage. The improved performance is necessary in some applications, whereas the increased leakage is not acceptable in others. Methods of controlling characteristics such as device strain allow designers to manage the tradeoffs posed by modern IC manufacturing techniques.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
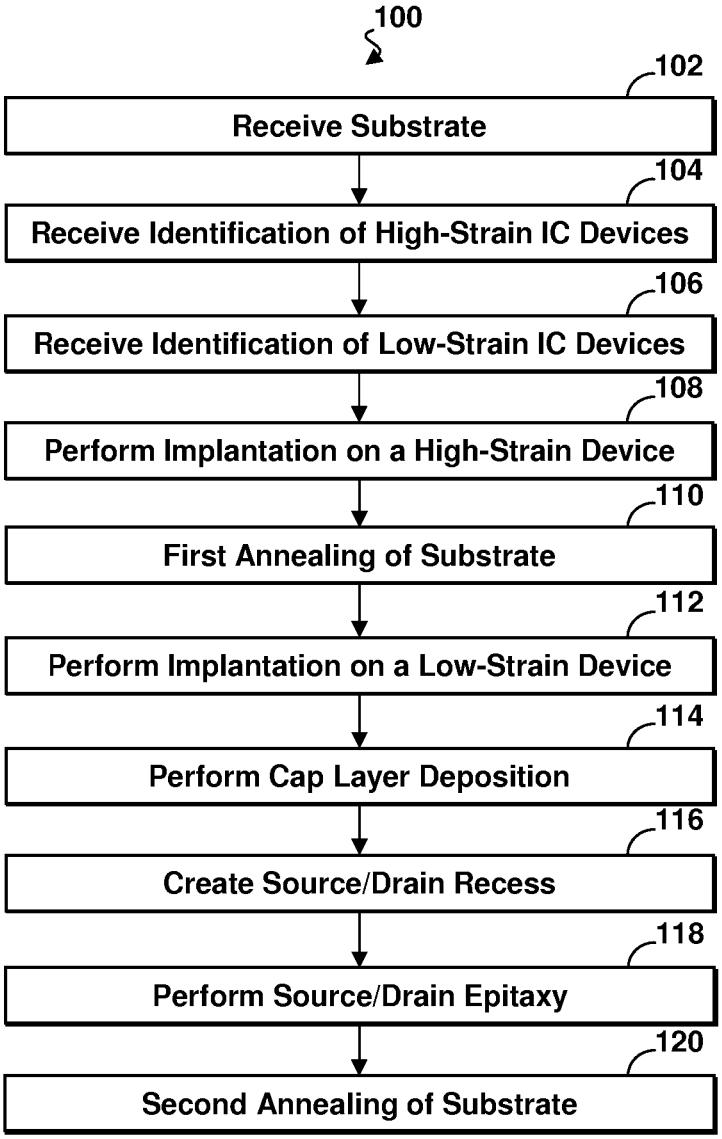
FIG. 1 is a flow diagram of a method for manufacturing an IC device according to aspects of the present disclosure.

The present disclosure relates generally to IC device manufacturing and more particularly, to a method for controlling device strain in IC devices and to the devices thereby formed.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

A method 100 for manufacturing an IC device and IC devices 200 and 250 are described with reference made to FIGS. 1-9. FIG. 1 is a flow diagram of the method 100 for manufacturing an IC device according to aspects of the present disclosure. It is understood that additional steps can be provided before, during, and after the method 100, and some of the steps described can be replaced or eliminated for other embodiments of the method. FIGS. 2-9 are sectional views of the first IC device 200 and the second IC device 250 according to various embodiments of the present disclosure.

Referring to FIG. 1, the method 100 begins at block 102 where a substrate 202 is received. The substrate may be a wafer, a semiconductor substrate, or any base material on which processing is conducted to produce layers of material, pattern features, and/or integrated circuits. In the present example, the substrate is a bulk silicon substrate. Alternatively, the semiconductor substrate includes an elementary semiconductor including silicon or germanium in crystal; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure. Alternatively, the substrate may include a non-semiconductor material, such as a glass substrate for thin-film-transistor liquid crystal display (TFT-LCD) devices, or fused quartz or calcium fluoride for a photomask (mask).

Some exemplary substrates include an insulator layer. The insulator layer comprises any suitable material, including silicon oxide, sapphire, other suitable insulating materials, and/or combinations thereof. An exemplary insulator layer may be a buried oxide layer (BOX), oxidation, deposition, and/or other suitable process. In some substrates, the insulator layer is a component (e.g., layer) of a silicon-on-insulator substrate.

The substrate may include various doped regions depending on design requirements as known in the art (e.g., p-type wells or n-type wells). The doped regions may be doped with p-type dopants, such as phosphorus or arsenic, and/or n-type dopants, such as boron or $BF_2$. The doped regions may be formed directly on the substrate, in a P-well structure, in a N-well structure, in a dual-well structure, or using a raised structure. The semiconductor substrate may further include various active regions, such as regions configured for an N-type metal-oxide-semiconductor transistor device (referred to as an NMOS) and regions configured for a P-type metal-oxide-semiconductor transistor device (referred to as a PMOS). It is understood that the first IC device 200 and the second IC device 250 may be formed by CMOS technology processing, and thus some processes are not described in detail herein.

The substrate 202 may further include one or more isolation regions on the substrate 202 to isolate various regions of the substrate, for example, to isolate NMOS and PMOS device regions. The isolation regions may utilize isolation technology, such as local oxidation of silicon (LOCOS) or shallow trench isolation (STI), to define and electrically isolate the various regions. The isolation regions can comprise silicon oxide, silicon nitride, silicon oxynitride, other suitable materials, or combinations thereof. The isolation regions can be formed by any suitable process. As one example, the formation of an STI may include a photolithography process, etching a trench in the substrate (for example, by using a dry etching and/or wet etching process), and filling the trench (for example, by using a chemical vapor deposition process) with one or more dielectric materials. The filled trench may have a multi-layer structure such as a thermal oxide liner layer filled with silicon nitride or silicon oxide.

Figure 2:
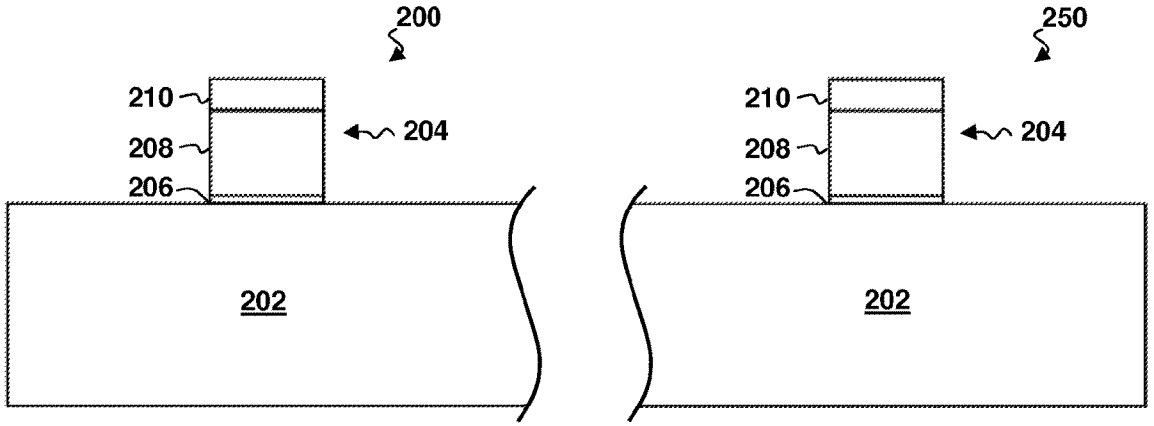
FIGS. 2-9 are sectional views of a first IC device and a second IC device according to various embodiments of the present disclosure.

As illustrated in FIG. 2, one or more gate stacks 204 may be formed on the substrate 202. In a gate first process, the gate stack 204 may be all or part of a functional gate. Conversely, in a gate last process, the gate stack 204 may be a dummy gate. An exemplary gate stack 204 includes an interfacial layer, a gate dielectric layer 206, a gate electrode layer 208, and a hard mask layer 210. An exemplary interfacial layer includes silicon oxide (e.g., thermal oxide or chemical oxide) and/or silicon oxynitride (SiON) and may be formed by any suitable process to any suitable thickness.

A gate dielectric layer 206 may comprise a dielectric material, such as silicon oxide, silicon nitride, silicon oxynitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The gate electrode layer 208 may include any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 210 may comprise any suitable material, for example, silicon, dioxide, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

The gate stack 204 is formed by any suitable process or processes. For example, the gate stack 204 can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

In block 104, an identification of IC devices that benefit from high-strain processes is received. In various embodiments, the identification is received from an integrated circuit design facility, from an integrated circuit manufacturer, from a manufacturing equipment provider, from a packaging facility, from an integrated circuit consumer, and/or from other design, manufacturing, and consuming facilities.

Devices may be identified based on an intrinsic property of the device. For example, IC devices with smaller critical dimensions may require greater carrier mobility in order to meet performance requirements. Thus, small-gate IC devices may be designated high-strain. High-strain devices may be identified based on a processing factor. For example, nMOS devices tend to benefit most from tensile strain, whereas pMOS devices derive performance benefits from compressive strain. For processes that induce tensile strain, nMOS devices may be designated high-strain. As a further example, a method for creating and memorizing strain may induce smaller strain forces on devices with smaller critical dimensions. This is typical for uniaxial strain processes. To compensate, smaller devices may be designated high-strain. Cumulative strain increases as the strained area increases. Thus, devices with larger gate-to-gate spacing may exhibit greater strain effects. This can lead to dislocations in IC devices having a larger strained volume. Dislocations tend to increase device leakage, which may not be acceptable. IC devices which are unlikely to form dislocations may be selected to undergo processes that create relatively greater device strain without adverse effects. High-strain devices may also be identified based on the application. For example, IC devices critical to overall performance may be designated high-strain. In many embodiments, devices are identified based on a combination of device properties, processing characteristics, and performance requirements. Other criteria for identifying high-strain devices are contemplated as well. Referring to FIG. 2, first IC device 200 is a high-strain IC device.

In block 106, an identification of low-strain IC devices is received. As with high-strain IC devices, low-strain IC devices may be identified by a device characteristic such as gate width, source/drain region area, process factors, performance characteristics, design considerations, and/or other suitable criteria. Referring to FIG. 2, second IC device 250 is a low-strain IC device.

Figure 3:
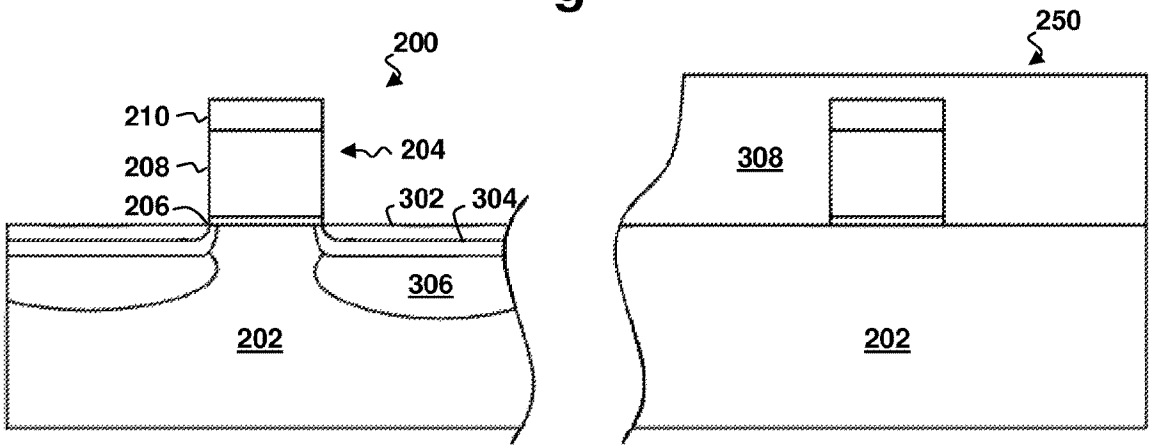

Referring to block 108 and FIG. 3, an implantation is performed on the source/drain regions of the high-strain devices. The implantation process or processes introduce dopant atoms into the substrate. The doping species depends on the type of device being fabricated and includes p-type dopants, such as boron or $BF_2$; n-type dopants, such as phosphorus or arsenic; and/or combinations thereof. Implantation may include forming lightly doped source/drain (LDD) regions 302. LDD regions 302 are formed in the substrate 202 by ion implantation processes, photolithography processes, diffusion processes, annealing processes (e.g., rapid thermal annealing and/or laser annealing processes), and/or other suitable processes. Implantation may also include forming halo/pocket regions 304, which can reduce short channel effects (e.g., punch-through effects). Processes used to create halo/pocket regions 304 may include a tilt-angle ion implantation, such as a large-angle tilted halo/pocket implantation. In an embodiment, the implantation process damages the lattice structure of the substrate 202 and forms amorphous regions 306. In a further embodiment, the halo/pocket region 304 and the amorphous regions 306 are formed by a single implantation. An implantation specifically designed to damage the lattice structure may be referred to as a pre-amorphization implantation (PAI). A PAI may be performed using a dopant, or, when doping is not desired, using a semiconductor such as Ge. A single PAI may involve both doping species and semiconductor species.

Referring to FIG. 3, in order to limit the implantation to only the source/drain regions of the high-strain devices, other devices on the substrate 202, including the low-strain devices, may be covered by a resist layer 308 prior to implantation. The resist layer 308 is patterned to expose only the high-strain devices to implantation. In an embodiment, the resist layer 308 is a photoresist. In a further embodiment, the resist layer 308 is a hard mask. Exemplary hard mask materials include an oxide material, such as silicon oxide; a nitrogen-containing material, such as silicon nitride or silicon oxynitride, an amorphous carbon material; silicon carbide; tetraethylorthosilicate (TEOS); other suitable materials; and/or combinations thereof. Patterning the resist layer 308 may include exposing the resist layer 308 to a pattern through a process such as photolithography, may include performing a post-exposure bake process, and may include developing the resist layer 308. Patterning may also be implemented or replaced by other proper methods, such as maskless photolithography, electron-beam writing, ion-beam writing, and molecular imprint. The resist layer 308 may be removed after implantation and prior to annealing.

Figure 4:
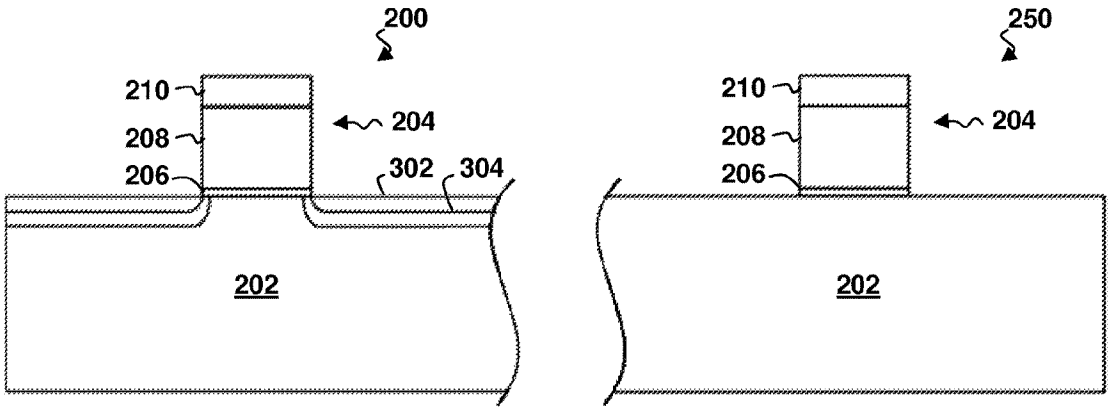

In block 110, an annealing process is performed in the substrate 202. Referring to FIGS. 3 and 4, in an embodiment, the annealing process restores the crystalline structure of amorphous regions 306. The annealing process may be a rapid thermal anneal (RTA) or a millisecond thermal anneal (MSA), such as a millisecond laser thermal anneal. In one embodiment, the annealing process is implemented in a rapid thermal annealing (RTA) tool. In another embodiment, the annealing process is applied to the substrate 202 with an annealing temperature ranging between about 700° C. and about 1500° C. In another embodiment, the annealing process is applied to the substrate 202 with an annealing duration ranging between about 2 milliseconds and about 30 seconds. The annealing process may include a long range pre-heat, which reduces or even eliminates end of range (EOR) defects. Suitable ranges for the long range pre-heat range from about 200° C. to about 700° C., and include other appropriate temperatures and ranges. The long range pre-heat may be performed for about 50 to about 300 seconds. In a particular embodiment, the long range pre-heat has a temperature of about 550° C. for about 180 seconds.

Figure 5:
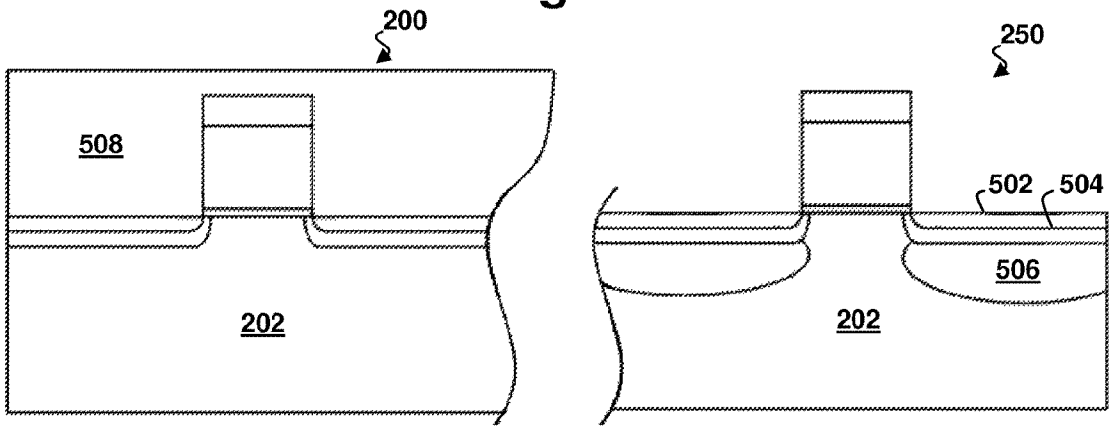

Referring to block 112 and FIG. 5, an implantation process is performed on the source/drain regions of the low-strain devices. This may include forming lightly doped source/drain (LDD) regions 502 and/or halo/pocket regions 504. In an embodiment, the implantation process includes a PAI that damages the lattice structure of the substrate 202 and forms amorphous regions 506. Referring to FIG. 5, in order to limit the implantation to only the source/drain regions of the low-strain devices, other devices on the substrate 202, including the high-strain device 200, may be covered by a resist layer 508. The resist layer 508 is patterned to expose only the low-strain devices to implantation. In an embodiment, the resist layer 508 is a photoresist layer. In another embodiment, the resist layer 508 is a hard mask. In an example of such an embodiment, the hard mask resist layer 508 is patterned using a photoresist layer. In many embodiments, the resist layer 508 is removed after the implantation process is performed.

Figure 6:
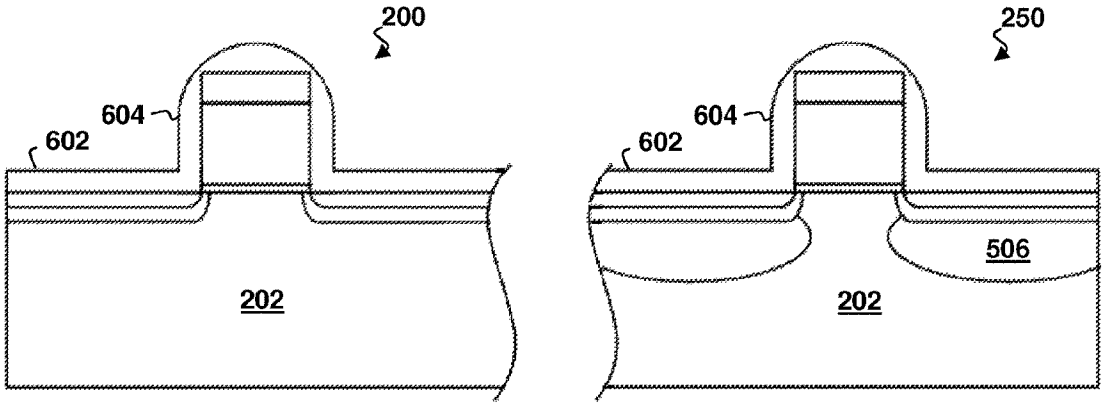

Referring to block 114 and FIG. 6, a capping layer 602 is deposited. In an embodiment, the capping layer 602 comprises a dielectric material, such as silicon oxide, silicon nitride, silicon oxynitride, other suitable materials, and/or combinations thereof. The capping layer 602 may be formed by thermal deposition, atomic layer deposition, plasma-enhanced chemical vapor deposition, other processes known to one of skill in the art and/or combinations thereof. The capping layer 602 may be used to form spacers 604 on the gate stack. In such embodiments, the deposition of the capping layer 602 is adapted to control the thickness of the spacers 604. In various examples, the thickness of a SiN capping layer 602 range from about 50 A to about 200 A, and the thickness of an oxide capping layer 602 range from about 15 A to about 50 A. In some embodiments, forming the capping layer 602 is followed by a chemical-mechanical planarization (CMP) process.

Figure 7:
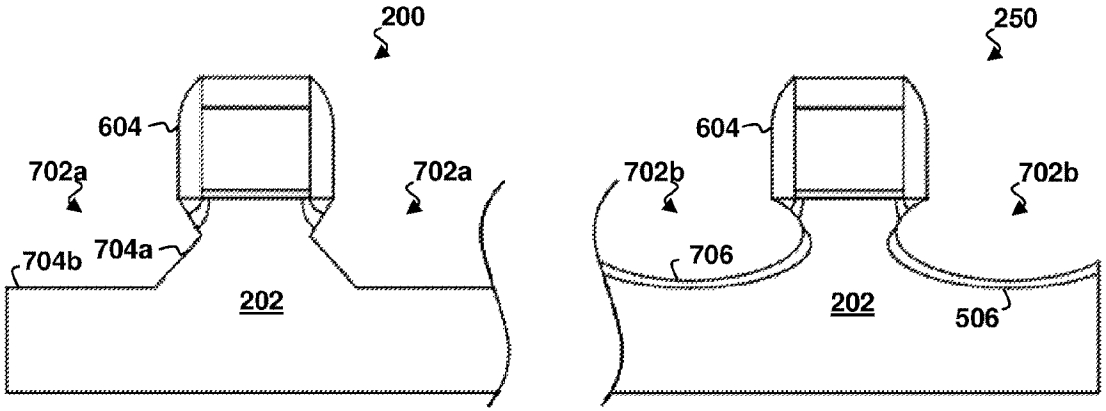

In block 116, source/drain recesses 702a and 702b are created, as shown in FIG. 7. Recess creation may include an etching process, such as a dry etching process, wet etching process, and/or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. After the etching process, a pre-cleaning process may be performed to clean the source/drain recesses 702a and 702b with a hydrofluoric acid (HF) solution or other suitable solution.

Even though the high-strain device and the low-strain device may undergo the same etching process, the structure of the source/drain regions may cause dramatically different etching profiles. In an illustrated embodiment, the source/drain regions of the high-strain device 200 are recrystallized during the post-implantation annealing. Therefore, the etching process can be configured to produce a source/drain recess 702a with uniform edges along a crystalline plane. In one of such embodiments, the etching profile of the source drain recess 702a is defined by a surface 704a in a {111} crystallographic plane of the substrate 202, and a surface 704b in a {100} crystallographic plane of the substrate 202. Conversely, the low-strain device 250 may not undergo a post-implantation annealing process, and therefore the source/drain regions may retain an amorphous structure. As a result, the etching process may produce a source/drain recess 702b with a different recess profile such as the arcuate surface 706.

In some embodiments, the etching step includes an anisotropic etching. Anisotropic etching is orientation dependent and may be used to create alternate recess profiles. For example, an etching may be performed using TMAH. Because TMAH is an anisotropic etchant, TMAH produces different etching profiles when used to etch uniformly crystalline regions compared to amorphous regions. Other anisotropic etchants include KOH and EDP (ethylene diamine and pyrocatechol). Dry etching may also be performed anisotropically using such mechanisms as DRIE (deep reactive-ion etching).

Figure 8:
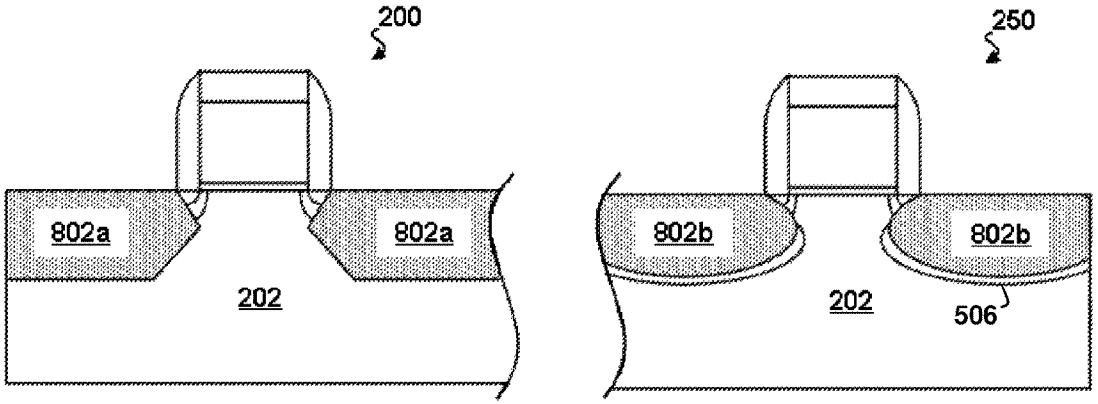

Referring to block 118 and FIG. 8, a source/drain epitaxy is performed. Epitaxy forms source/drain structures 802a and 802b in the recesses 702a and 702b of the substrate by depositing a semiconductor material. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi process, or combination thereof. The epi process may use gaseous and/or liquid precursors, which may interact with the composition of the substrate 202. In an example, where an NFET device is desired, the source/drain structures include epitaxially grown silicon (epi Si). Alternatively, where a PFET device is desired, the source/drain structures include epitaxially grown silicon germanium (SiGe). The source/drain structures may be in-situ doped or undoped during the epi process. For example, the epitaxially grown SiGe source/drain features may be doped with boron; and the epitaxially grown Si epi source/drain features may be doped with carbon to form Si:C source/drain features, phosphorous to form Si:P source/drain features, or both carbon and phosphorous to form SiCP source/drain features. When the source/drain features are undoped, it is understood that they may be doped in a subsequent process. The doping may be achieved by an ion implantation process, plasma immersion ion implantation (PIII) process, gas and/or solid source diffusion process, other suitable process, or combinations thereof.

Figure 9:
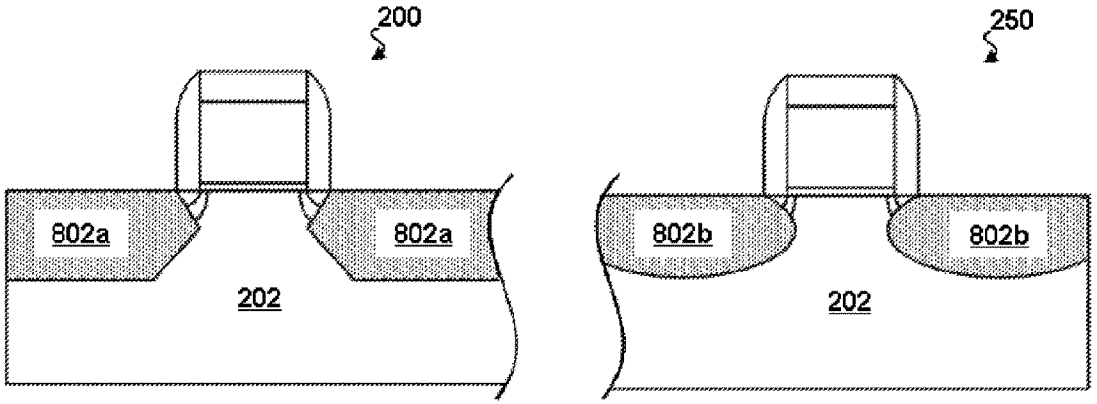

Referring to block 120 and FIG. 9, an annealing process may be performed on the substrate 202 and the source/drain structures 802a and 802b. Annealing processes include rapid thermal annealing (RTA) and a millisecond thermal annealing (MSA), such as millisecond laser thermal annealing. The annealing process may also include a long range pre-heat. In an embodiment, the annealing process includes a pre-heat performed by epitaxial equipment used to perform the source/drain epitaxy of block 118. In an embodiment, the annealing process recrystallizes amorphous structures within the source/drain regions such as region 802b as well as structures within the substrate 202 such as the amorphous region 506 of FIG. 8.

Figure 10:
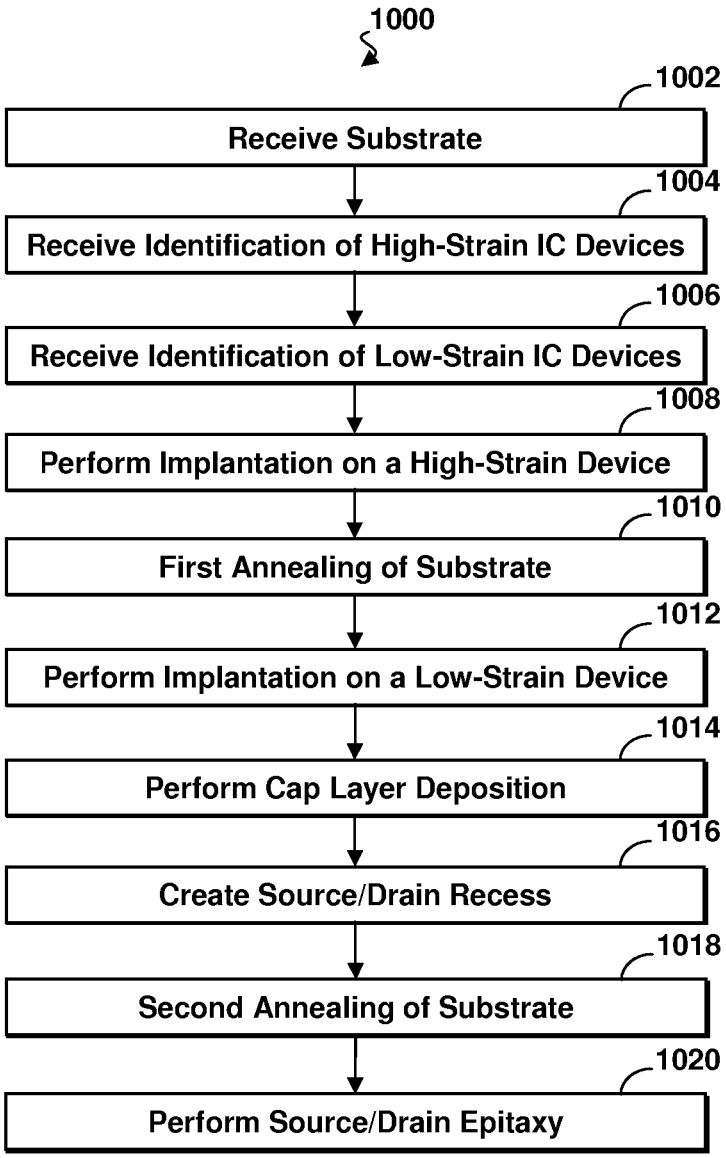
FIG. 10 is a flow diagram of a method for manufacturing an IC device according to aspects of the present disclosure.
Figure 11:
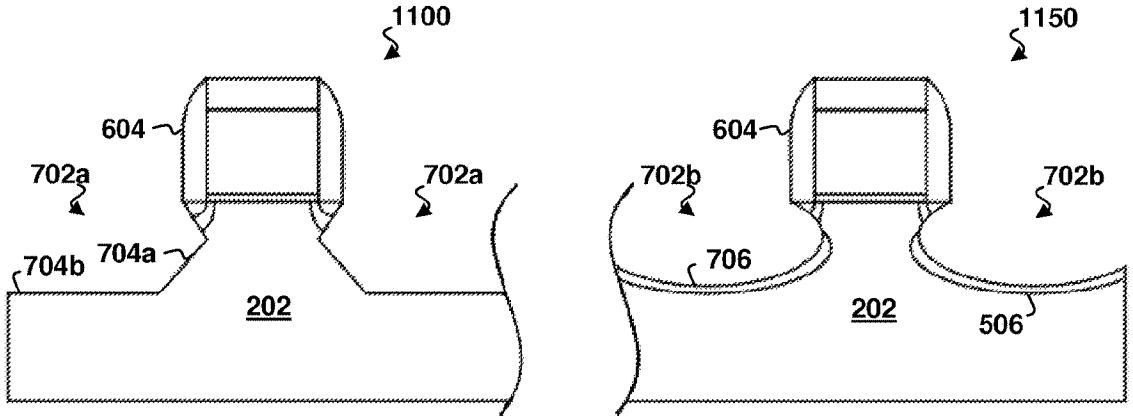
FIGS. 11-13 are sectional views of a first IC device and a second IC device according to various embodiments of the present disclosure.
Figure 12:
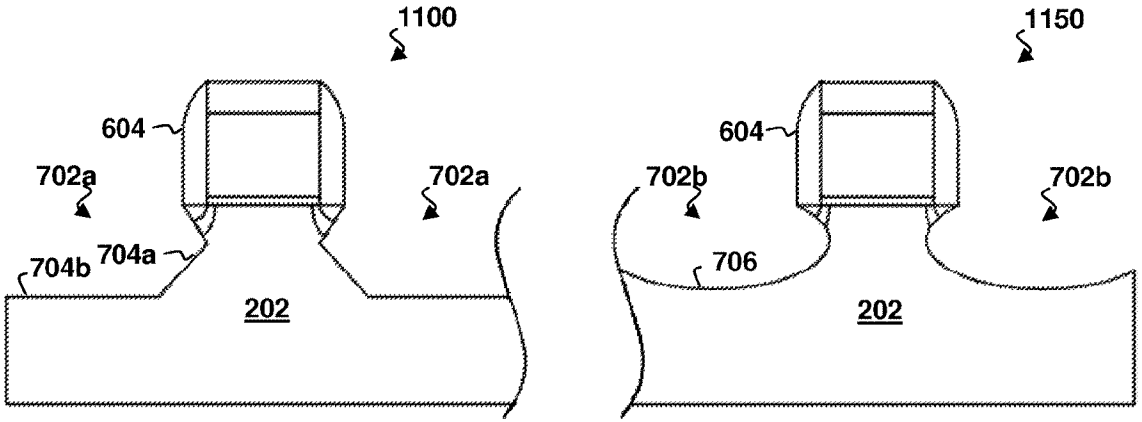
Figure 13:
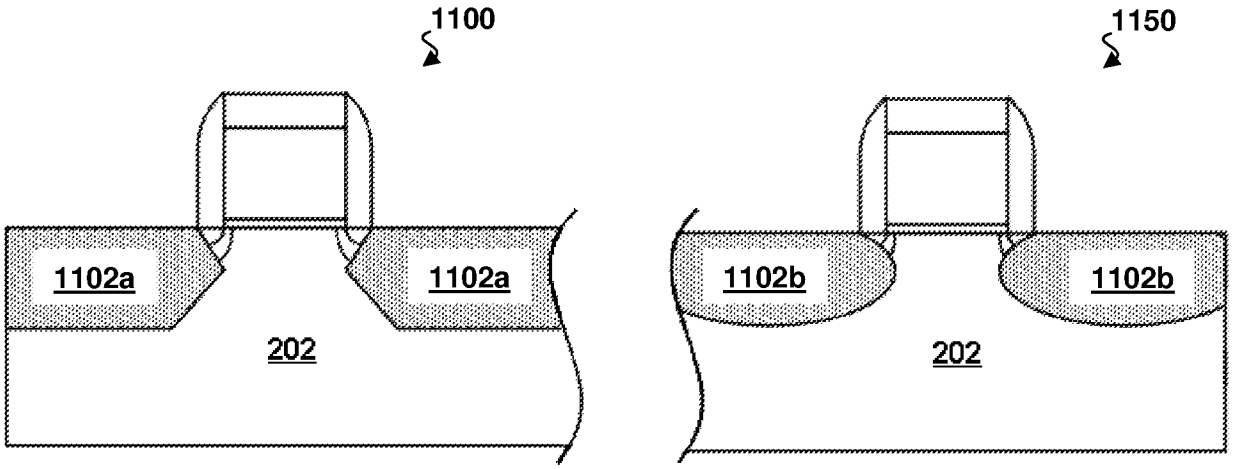

A further embodiment of a method 1000 for manufacturing an IC device and IC devices 1100 and 1150 are described with reference made to FIGS. 10-13. FIG. 10 is a flow diagram of the method 1000 for manufacturing an IC device according to aspects of the present disclosure. It is understood that additional steps can be provided before, during, and after the method 1000, and some of the steps described can be replaced or eliminated for other embodiments of the method. The embodiment of method 1000 may include similar process steps as embodiments of the method 100, which is disclosed above. With respect to method 1000, some details regarding processing and/or structure may be skipped for simplicity if they are similar to those described in the embodiment of method 100. FIGS. 11-13 are sectional views of the first IC device 1100 and the second IC device 1150 according to various embodiments of the present disclosure. The semiconductor devices 1100 and 1150 of FIGS. 11-13 are similar in certain respects to the semiconductor devices 200 and 250 of FIGS. 2-9. Accordingly, similar features in FIGS. 2-9 and FIGS. 11-13 are identified by the same reference numerals for clarity and simplicity. In this way, FIGS. 11-13 have been simplified for the sake of clarity to better convey the inventive concepts of the present disclosure.

Referring to block 1002 of FIG. 10, the method 1000 begins with the receipt of a substrate. The receipt of the substrate in block 1002 is substantially similar to that of block 102 of method 100 of FIG. 1. In that regard, the substrate may be a wafer, a semiconductor substrate, and/or any other base material on which processing is conducted. The substrate may include an insulator layer, various doped regions, isolation regions, and/or one or more gate stacks. Referring to block 1004 of FIG. 10, an identification of IC devices to undergo a high-strain process is received. The receipt of the identification of high-strain IC devices in block 1004 is substantially similar to that of block 104 of method 100 of FIG. 1. Referring to block 1006 of FIG. 10, an identification of IC devices to undergo a low-strain process is received. The receipt of the identification of low-strain IC devices in block 1006 is substantially similar to that of block 106 of method 100 of FIG. 1. Referring to block 1008 of FIG. 10, an implantation is performed on a high-strain device. The implantation in block 1008 is substantially similar to that of block 108 of method 100 of FIG. 1. For example, as described with respect to block 108, the implantation may include the formation of a resist layer over areas that are not intended to be implanted. Referring to block 1010 of FIG. 10, an annealing is performed on the substrate. The annealing in block 1010 is substantially similar to that of block 110 of method 100 of FIG. 1. Referring to block 1012 of FIG. 10, an implantation is performed on a low-strain device. The implantation in block 1012 is substantially similar to that of block 112 of method 100 of FIG. 1. For example, as described with respect to block 112, the implantation may include the formation of a resist layer over areas that are not intended to be implanted. Referring to block 1014 of FIG. 10, a capping layer is deposited. The deposition in block 1014 is substantially similar to that of block 114 of method 100 of FIG. 1.

Referring now to block 1016 of FIG. 10 and to FIG. 11, source/drain recesses 702a and 702b are created. Source/drain recesses 702a and 702b are substantially similar to recesses 702a and 702b of FIG. 7 and are formed by a process substantially similar to that of block 116 of method 100 of FIG. 1. For example, source/drain recesses 702a and 702b of FIG. 11 may be created by an etching process, such as a dry etching process, wet etching process, and/or combination thereof. In an embodiment, the etching process is configured to produce a source/drain recess 702a with uniform edges along a crystalline plane. In one of such embodiments, the etching profile of the source drain recess 702a is defined by a surface 704a in a {111} crystallographic plane of the substrate 202, and a surface 704b in a {100} crystallographic plane of the substrate 202. In a further embodiment, the etching process may produce a source/drain recess 702b with a different recess profile such as the arcuate surface 706.

Further referring to FIG. 11, substrate 202 of FIG. 11 is substantially similar to substrate 202 of FIG. 7. Likewise, amorphous region 506 of FIG. 11 is substantially similar to amorphous region 506 of FIG. 7, and spacers 604 on the gate stack of FIG. 11 are substantially similar to spacers 604 on the gate stack of FIG. 7.

Referring to block 1018 and FIG. 12, in an embodiment, an annealing process is performed on the recessed substrate 202 prior to source/drain epitaxy. In one such embodiment, the annealing process restores the crystalline structure of amorphous regions such as amorphous region 506 of FIG. 11. In an embodiment, the annealing process includes a pre-heat process carried out by equipment further suitable for an epitaxial growth process. For example, the temperature of the annealing process may be between about 500° C. and about 800° C. In an embodiment, the duration of the annealing process is between about 10 second and about 600 seconds.

Referring to block 1020 and FIG. 13, source/drain epitaxy is performed on the annealed substrate. The epitaxial process of block 1020 is substantially similar to that of block 120 of method 100 of FIG. 1. For example, the epitaxial process of block 1020 may form source/drain structures 802a and 802b in the recesses 702a and 702b of the substrate by depositing a semiconductor material. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epitaxial process, or combination thereof. The epitaxial process may use gaseous and/or liquid precursors, which may interact with the composition of the substrate 202. The source/drain structures may be in-situ doped or may be formed undoped during the epitaxial process.

As will be obvious to one of skill in the art, a method to control the strain present in a device and to produce a single substrate with high- and low-strain devices provides designers and manufacturers the ability to balance the benefits of strained-channel devices against the tradeoffs including increased power consumption. Thus, the present disclosure provides a method for producing differently strained IC devices on a single substrate and provides the devices thereby formed.

In one embodiment, the method comprises: receiving an IC device substrate having a device region corresponding to an IC device; performing an implantation process on the device region, thereby forming an amorphous region having an amorphous crystalline structure, the amorphous region disposed within the device region; recessing the IC device substrate to define a source/drain recess in the device region, wherein the recessing is configured to define the source/drain recess as having a profile determined by the amorphous crystalline structure of the amorphous region; and performing source/drain epitaxy after the recessing of the IC device substrate to form a source/drain structure within the source/drain recess.

In a further embodiment, the semiconductor device comprises: an IC device substrate having a device region corresponding to a IC device; a gate stack disposed within the device region and defining a source/drain region of the IC device substrate; and a source/drain structure disposed within the source/drain region, wherein the source/drain structure defines a surface between the IC device substrate and the source/drain structure; and wherein the surface has an arcuate profile.

In yet another embodiment, the semiconductor device comprises: an IC device substrate having a first device region corresponding to a first IC device and a second device region corresponding to a second IC device; a first gate stack disposed within the first device region and defining a first source/drain region, wherein the first source/drain region includes a first source/drain structure disposed within the IC device substrate, and wherein the first source/drain structure has a first profile; a second gate stack disposed within the second device region and defining a second source/drain region, wherein the second source/drain region includes a second source/drain structure disposed within the IC device substrate, wherein the second source/drain structure has a second profile, and wherein the first profile and the second profile are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:

receiving an IC device substrate having a first device region corresponding to a first IC device and a second device region corresponding to a second IC device;

receiving an identification of the first IC device as a low-strain IC device based on one of a gate size of the first IC device, a critical dimension of the first IC device, and a device spacing of the first IC device;

performing an implantation process on the first device region, thereby forming a first amorphous region having an amorphous crystalline structure, the first amorphous region disposed within the first device region;

recessing the IC device substrate to define a first source/drain recess having a first profile in the first device region and a second source/drain recess having a second profile in the second device region, wherein the recessing is configured to define the first source/drain recess as having the first profile determined by the amorphous crystalline structure of the first amorphous region, and wherein the first profile of the first source/drain recess is different from the second profile of the second source/drain recess; and performing source/drain epitaxy after the recessing of the IC device substrate to form a first source/drain structure within the first source/drain recess and to form a second source/drain structure within the second source/drain recess, wherein the performing of the implantation process is performed based on the identification of the first IC device.

2. The method of claim 1, further comprising annealing the IC device substrate after the performing of the source/drain epitaxy.

3. The method of claim 1, further comprising annealing the IC device substrate after the recessing of the IC device substrate and before the performing of the source/drain epitaxy.

4. The method of claim 1, wherein the recessing of the IC device substrate is configured to define the first profile of the first source/drain recess as having an arcuate surface.

5. The method of claim 1, wherein the recessing of the IC device substrate includes performing an anisotropic etch.

6. The method of claim 1, wherein the performing of the implantation process on the device region further forms a lightly doped source/drain region and a halo/pocket implant region, the lightly doped source/drain region and the halo/pocket implant region disposed within the first device region.

7. The method of claim 1 further comprising:, performing an implantation process on the second device region thereby forming a second amorphous region having an amorphous crystalline structure, the second amorphous region disposed within the second device region;

annealing the IC device substrate to form a regular crystalline structure from the amorphous crystalline structure of the second amorphous region, wherein the recessing of the IC device substrate is further configured to define the second source/drain recess as having the second profile determined by the regular crystalline structure of the second amorphous region.

8. The method of claim 7, further comprising receiving an identification of the second IC device as a high-strain IC device based on one of a gate size of the second IC device, a critical dimension of the second IC device, and a device spacing of the second IC device, and wherein the performing of the implantation process on the second device region is performed based on the identification of the second IC device.

9. The method of claim 7, wherein the recessing of the IC device substrate to define the first source/drain recess and the recessing of the IC device substrate to define the second source/drain recess are performed simultaneously.

10. The method of claim 7, wherein the performing of the source/drain epitaxy forms the first source/drain structure and the second source/drain structure concurrently.

[11. A semiconductor device comprising:

an IC device substrate having a first device region corresponding to a first IC device and a second device region corresponding to a second IC device;

a first gate stack disposed within the first device region and defining a first source/drain region of the IC device substrate;

a first epitaxial source/drain structure containing an epitaxial material disposed within the first source/drain region;

a second gate stack disposed within the second device region and defining a second source/drain region of the IC device substrate; and a second epitaxial source/drain structure containing the epitaxial material disposed within the second source/drain region, wherein the first source/drain structure defines a first surface between the IC device substrate and the first source/drain structure;

wherein the second source/drain structure defines a second surface between the IC device substrate and the epitaxial material disposed within the second source/drain structure;

wherein the first surface has an arcuate profile;

wherein the second surface has a profile different from the arcuate profile of the first surface;

wherein the second surface extends underneath a spacer disposed on the side of the second gate stack; and wherein the epitaxial material disposed within the second source/drain structure extends underneath the spacer and has a top surface that is substantially coplanar with a top surface of the IC device substrate.]

[12. The device of claim 11, wherein the first profile of the first surface between the IC device substrate and the first source/drain structure is configured to reduce a device strain present in the first IC device.]

[13. The device of claim 11, wherein the first device region includes a halo/pocket region.]

[14. The device of claim 11, wherein the first device region includes a lightly doped source/drain region.]

15. A semiconductor device comprising:

an IC device substrate having a first device region corresponding to a first IC device and a second device region corresponding to a second IC device;

a first gate stack disposed within the first device region and defining a first source/drain region, wherein the first source/drain region includes a first epitaxial source/drain structure including [an] *a first* epitaxially-grown semiconductor material disposed within the IC device substrate, wherein the first *epitaxial* source/drain structure has a first profile that includes a *first* surface between the IC device substrate and the *first* epitaxially-grown semiconductor material of the first epitaxial source/drain structure, wherein the *first* surface extends underneath a first spacer disposed on a side of the first gate stack, and wherein the *first* epitaxially-grown semiconductor material of the first epitaxial source/drain structure extends underneath the first spacer [and has a top surface that is substantially coplanar with a top surface of the IC device substrate];

a second gate stack disposed within the second device region and defining a second source/drain region, wherein the second source/drain region includes a second epitaxial source/drain structure including [the] *a second* epitaxially-grown semiconductor material disposed within the IC device substrate, wherein the *second* epitaxially-grown semiconductor material of the second epitaxial source/drain structure extends underneath a second spacer disposed on the side of the second gate stack [and has a top surface that is substantially coplanar with the top surface of the IC device substrate], wherein the second source/drain structure has a second profile, and wherein the first profile and the second profile are different*;*

*a first implant region having a recrystallized structure disposed in the substrate in the first device region; and*

*a second implant region having a recrystallized structure disposed in the substrate in the second device region.*

16. The device of claim 15, wherein the *first* surface of the first profile has a first portion directed along a first lattice facet of the IC device substrate;

wherein the *first* surface of the first profile further has a second portion directed along a second lattice facet of the IC device substrate; and wherein the first portion and the second portion have a common vertex.

17. The device of claim 15, wherein the second [profile has] *surface is* an arcuate surface.

18. The device of claim 15, wherein the first profile is configured to increase device strain present in the first source/drain region, and wherein the second profile is configured to reduce device strain present in the second source/drain region.

19. The device of claim 15, wherein the first device region includes a first halo/pocket region and wherein the second device region includes a second halo/pocket region.

*20. A semiconductor device comprising:*

*a substrate having a first device region corresponding to a first device and a second device region corresponding to a second device, wherein the first device is a first-strain device;*

*a first gate stack disposed within the first device region and a second gate stack disposed within the second device region;*

*a first implant region having a recrystallized structure disposed within the first device region and implanted based on one of a size of the first device, a critical dimension of the first device, and a device spacing of the first device;*

*a first source/drain recess in the substrate and having a first profile in the first device region and a second source/drain recess in the substrate and having a second profile in the second device region, wherein the first profile of the first source/drain recess is different from the second profile of the second source/drain recess; and*

*a first source/drain epitaxial structure within the first source/drain recess and a second source/drain epitaxial structure within the second source/drain recess, wherein the first source/drain epitaxial structure extends underneath a first spacer disposed along a sidewall of the first gate stack and the second source/drain epitaxial structure extends underneath a second spacer disposed along a sidewall of the second gate stack.*

*21. The semiconductor device of claim 20, wherein the first source/drain recess has an arcuate surface.*

*22. The semiconductor device of claim 20, wherein the first source/drain recess has a profile according to an anisotropic etch.*

*23. The semiconductor device of claim 20, further comprises:*

*a lightly doped source/drain region and a halo/pocket implant region disposed within the first device region.*

*24. The semiconductor device of claim 20 further comprising:*

*a second implant region having a recrystallized structure, the second region being disposed within the second device region.*

*25. The semiconductor device of claim 24, wherein the second device is a second-strain device, wherein the second strain is different from the first strain, and wherein the second implant region has a recrystallized structure based on one of a size of the second device, a critical dimension of the second device, and a device spacing of the second device.*

*26. The semiconductor device of claim 25, wherein the first profile is configured to increase the first strain of the first device, and wherein the second profile is configured to reduce the second strain of the second device.*

*27. The semiconductor device of claim 20, wherein the first device region includes a first halo/pocket region and wherein the second device region includes a second halo/pocket region.*

* * * * *